(12) United States Patent
Han et al.

(10) Patent No.: US 11,729,998 B2
(45) Date of Patent: Aug. 15, 2023

(54) SEMICONDUCTOR MEMORY DEVICE HAVING A VARIABLE RESISTENCE LAYER

(71) Applicant: SK hynix Inc., Icheon-si (KR)

(72) Inventors: Jae-Hyun Han, Icheon-si (KR); Hyang-Keun Yoo, Seongnam-si (KR); Se-Ho Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 49 days.

(21) Appl. No.: 17/498,849

(22) Filed: Oct. 12, 2021

(65) Prior Publication Data

US 2022/0028931 A1     Jan. 27, 2022

Related U.S. Application Data

(63) Continuation of application No. 16/713,163, filed on Dec. 13, 2019, now Pat. No. 11,171,178.

(30) Foreign Application Priority Data

Jul. 25, 2019    (KR) ........................ 10-2019-0090127

(51) Int. Cl.
    *H10B 63/00*        (2023.01)
    *G11C 5/06*          (2006.01)
    *G11C 13/00*        (2006.01)
    *H10N 70/00*       (2023.01)

(52) U.S. Cl.
    CPC .............. *H10B 63/84* (2023.02); *G11C 5/06* (2013.01); *G11C 13/0002* (2013.01); *H10N 70/826* (2023.02)

(58) Field of Classification Search
CPC ... H01L 27/2481; H01L 45/1233; G11C 5/06; G11C 13/0002; H10B 63/84; H10N 70/826
USPC ............................................................. 257/4
See application file for complete search history.

(56) References Cited

U.S. PATENT DOCUMENTS

| 8,436,414 B2 | 5/2013 | Tanaka et al. |
| 2010/0207194 A1* | 8/2010 | Tanaka .............. H01L 27/11578 438/588 |
| 2010/0265773 A1 | 10/2010 | Lung et al. |
| 2016/0056168 A1* | 2/2016 | Lue ........................ G11C 16/26 438/586 |

FOREIGN PATENT DOCUMENTS

| KR | 10-1117398 B1 | 8/2010 |
| KR | 10-1742095 B1 | 12/2015 |
| KR | 1020200078048 A | 7/2020 |

* cited by examiner

*Primary Examiner* — Jami Valentine Miller

(57) ABSTRACT

An electronic device including a semiconductor memory is provided. The semiconductor memory includes: a substrate having a substantially horizontal upper surface; first to Nth layers (where N is a natural number of two or more) disposed in horizontal layers on the substrate and spaced apart from each other above the substrate in a vertical direction, wherein each of the first to Nth layers includes a plurality of conductive lines; an insulating layer disposed to fill spaces between the conductive lines; a hole having sidewalls that extends in the vertical direction through the conductive lines of the first to Nth layers and the insulating layer therebetween; a variable resistance layer disposed on the sidewalls of the hole; and a conductive pillar disposed to fill the hole in which the variable resistance layer is formed.

4 Claims, 20 Drawing Sheets

SEMICONDUCTOR MEMORY DEVICE HAVING A VARIABLE RESISTENCE LAYER

CROSS-REFERENCE TO RELATED APPLICATIONS

The present application is a continuation application of a U.S. patent application Ser. No. 16/713,163, filed on Dec. 13, 2019, which claims priority under 35 U.S.C. § 119(a) to Korean Patent Application No. 10-2019-0090127, filed on Jul. 25, 2019, which is incorporated herein by reference in its entirety.

TECHNICAL FIELD

Various embodiments of the present disclosure relate to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers and portable communication devices have been in demand, and research into semiconductor devices with superior memory storage capabilities and efficiencies has been conducted. Such semiconductor devices include devices that can store data and switch between different resistance states based on different applied voltages or current levels. Examples include RRAM (resistive random access memory) devices, PRAM (phase change random access memory) devices, FRAM (ferroelectric random access memory) device, MRAM (magnetic random access memory) devices, and an E-fuse.

SUMMARY

Various embodiments of the present disclosure include various implementations of an electronic device capable of achieving a high level of integration, increasing efficiencies and reducing processing difficulties in memory cells, and methods for fabricating the same.

In an embodiment, an electronic device includes a semiconductor memory, which includes: a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more.

In another embodiment, an electronic device includes a semiconductor memory, which includes: a substrate having a substantially horizontal upper surface; first to Nth layers (where N is a natural number of two or more) disposed in horizontal layers on the substrate and spaced apart from each other above the substrate in a vertical direction, wherein each of the first to Nth layers includes a plurality of conductive lines; an insulating layer disposed to fill spaces between the conductive lines; a hole having sidewalls that extends in the vertical direction through the conductive lines of the first to Nth layers and the insulating layer therebetween; a variable resistance layer disposed on the sidewalls of the hole; and a conductive pillar disposed to fill the hole in which the variable resistance layer is formed.

In another embodiment, a method for fabricating an electronic device comprising a semiconductor memory, includes: alternately forming first to Nth layers (where N is a natural number of two or more) with an insulating layer over a substrate in a vertical direction, wherein each of the first to Nth layers includes a plurality of conductive lines; forming a hole with sidewalls in which the conductive lines of the first to Nth layers are exposed by selectively etching the insulating layer between the conductive lines; forming a variable resistance layer on a sidewall of the hole; and forming a conductive pillar to fill the hole in which the variable resistance layer is formed.

These and other aspects, embodiments and associated advantages are described in greater detail in the drawings, the description and the claims.

DETAILED DESCRIPTION

Figure 1A:
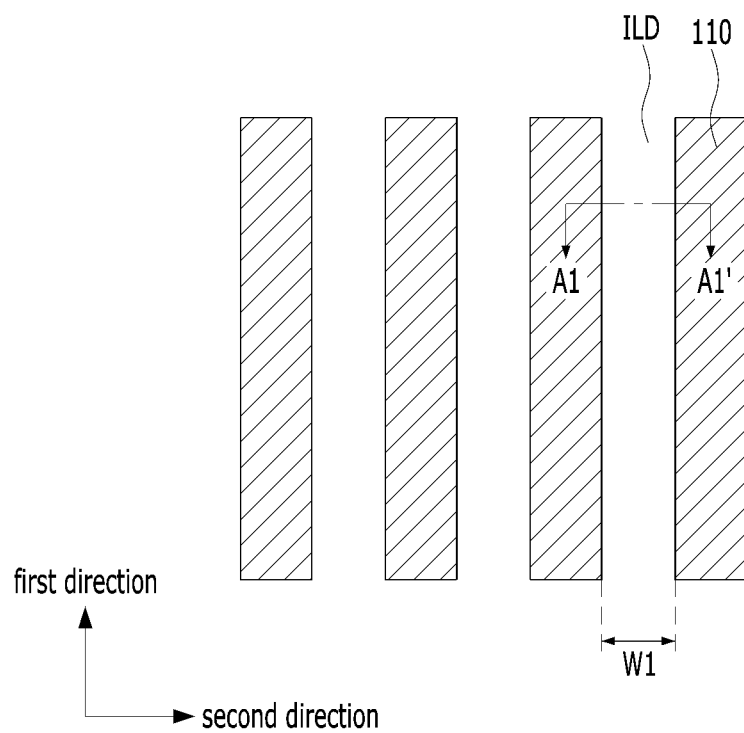
FIGS. 1A to 3B are views illustrating semiconductor memory devices and methods of fabricating the same according to embodiments of the present disclosure.

Various examples and embodiments of the disclosed technology are described below in detail with reference to the accompanying drawings.

The drawings may not be necessarily to scale and in some instances, proportions of at least some of the structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example, and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, however, one or more other intermediate layers may exist between the first layer and the second layer or the substrate in other instances.

FIGS. 1A to 3B are views illustrating semiconductor memory devices and methods of fabricating the same according to embodiments of the present disclosure, and a method for fabricating the same. FIGS. 1A, 2A and 3A show planar views, and FIGS. 1B, 2B, 2C and 3B show cross-sectional views taken along a line A-A' of FIGS. 1A, 2A and 3A, respectively.

First, fabricating methods will be described.

Figure 1B:
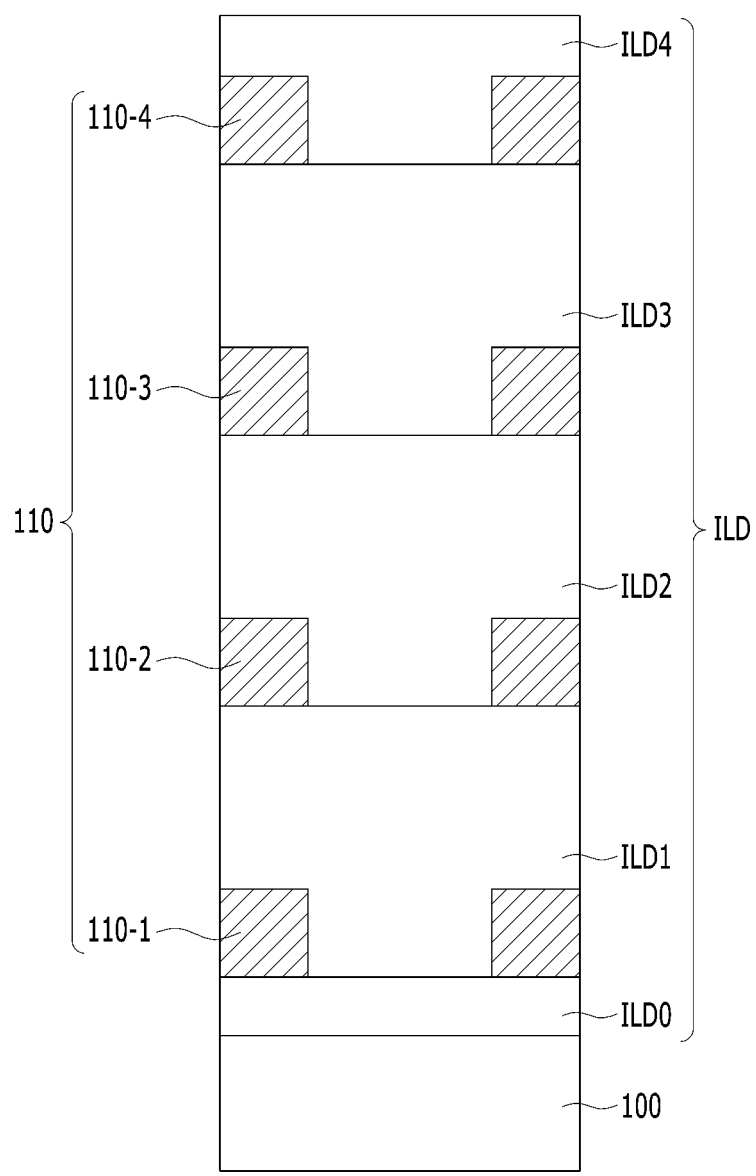

Referring to FIGS. 1A and 1B, a stacked structure of word lines 110 and interlayer insulating layers ILD may be formed over a substrate 100, in which a predetermined lower structure such as, for example, a transistor (not shown) for controlling the word lines 110 and/or bit lines, is formed.

The word lines 110 may be stacked in multiple layers in a direction perpendicular to a surface of the substrate 100. In an embodiment, the word lines 110 are stacked in four layers, but the number of layers of the word lines 110 may be variously modified in other embodiments contemplated by the disclosure. For convenience of description, the word lines 110 of the four layers may be indicated by word lines 110-1 of a first layer closest to the substrate, word lines 110-2 of a second layer, word lines 110-3 of a third layer, and word lines 110-4 of a fourth layer furthest along the vertical axis (e.g., a z-axis) from the substrate 100. The word lines 110 of any one layer may extend in a first direction (e.g., an x-direction) and parallel to the surface of the substrate 100, and be arranged to be spaced apart from each other in a second direction (e.g., a y-direction). In an embodiment, there are four word lines 110 in any given layer, however, the number of word lines in a word line layer and the number of word line layers may be variously modified in other embodiments contemplated by the disclosure.

The word lines 110 may be separated from each other by the interlayer insulating layers ILD. As an example, the word lines 110-1 of the first layer may be separated from each other and from word lines 110-2 of the second layer by a first interlayer insulating layer ILD1 that covers the word lines 110-1. Similarly, the word lines 110-2 of the second layer may be separated from each other and from the word lines 110-3 of the third layer by a second interlayer insulating layer ILD2 that covers word lines 110-2. The word lines 110-3 of the third layer may be separated from each other and from the word lines 110-4 of the fourth layer by a third interlayer insulating layer ILD3. The word lines 110-4 of the fourth layer may be separated from each other by a fourth interlayer insulating layer ILD4. The word lines 110 may be separated from the substrate 100 by an initial interlayer insulating layers ILD0.

The stacked structure of the word lines 110 and the interlayer insulating layers ILD may be formed by following processes. First, an initial interlayer insulating layer ILD0 may be formed over the substrate 100. When an uppermost part of the substrate 100 is formed of an insulating material, the initial interlayer insulating layer ILD0 may be omitted. Subsequently, a conductive material may be deposited over the initial interlayer insulating layer ILD0 and selectively etched to form the word lines 110-1 of the first layer. The word lines 110-1 are spaced apart from each other in a second direction while extending in a first direction. Subsequently, the first interlayer insulating layer ILD1 may be formed to cover the word lines 110-1 of the first layer and any exposed spaces therebetween. The first interlayer insulating layer ILD1 may fill spaces between the word lines 110-1 of the first layer and have a top surface planarized above top surfaces of the word lines 110-1 of the first layer. Subsequently, the word lines 110-2 of the second layer may be formed over the first interlayer insulating layer ILD1. The process of forming the word lines 110-2 of the second layer may be substantially the same as the process of forming the word lines 110-1 of the first layer. Accordingly, the word lines 110-2 of the second layer may have the same or substantially the same line width and are at the same or substantially the same position, relative to the first and second directions, as the word lines 110-1 of the first layer. That is, the word lines 110-2 of the second layer may overlap or substantially overlap the word lines 110-1 of the first layer when viewed in a planar view (e.g., a view looking in the z-direction). In a similar manner, the second interlayer insulating layer ILD2, the word lines 110-3 of the third layer, the third interlayer insulating layer ILD3, the word lines 110-4 of the fourth layer, and the fourth interlayer insulating layer ILD4 may be formed in turn. The interlayer insulating layers ILD may include various insulating materials such as silicon oxide, silicon nitride, or a combination thereof, and the word lines 110 may include various conductive materials such as metal, metal nitride, or a combination thereof.

Figure 2A:
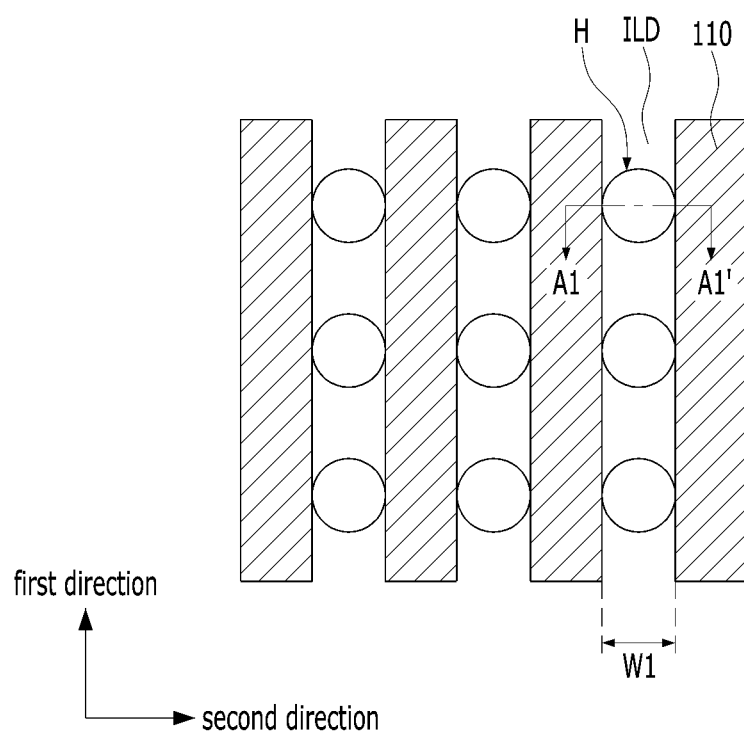
Figure 2B:
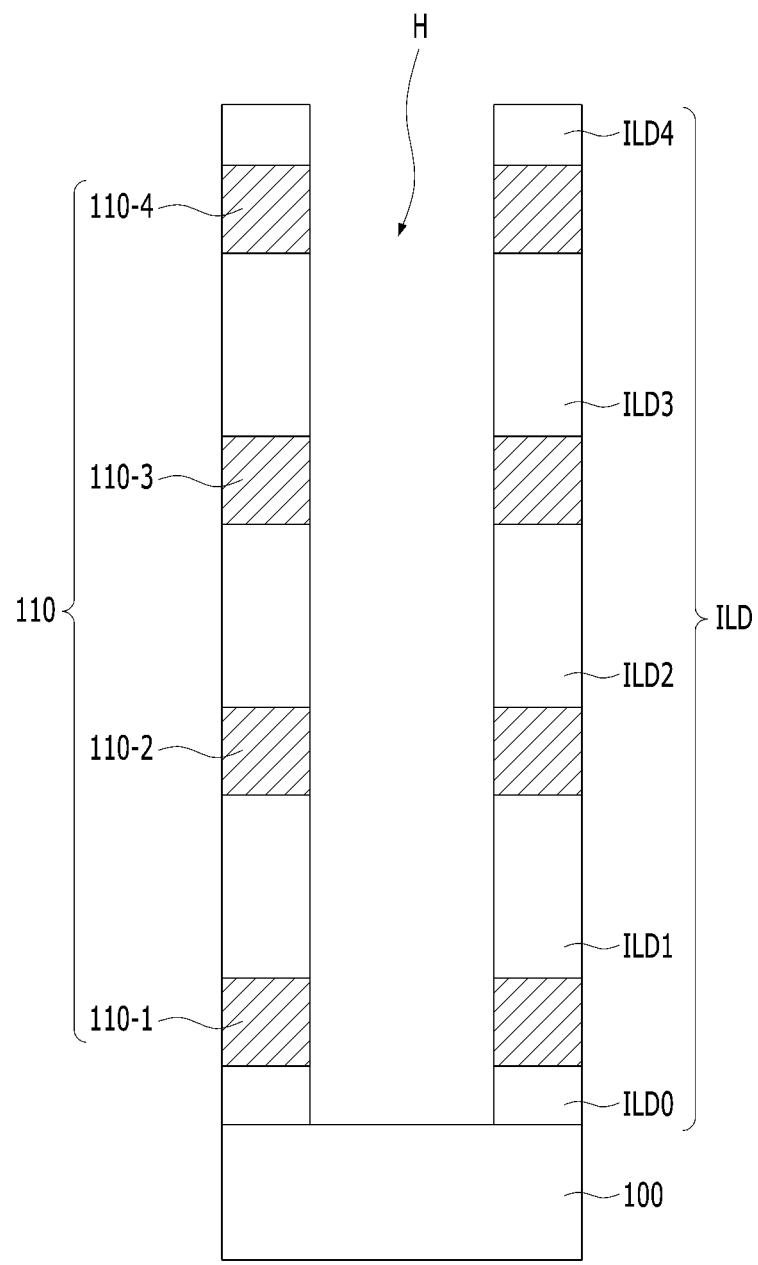

Referring to FIGS. 2A and 2B, the stacked structure of the word lines 110 and the interlayer insulating layers ILD may be selectively etched to form a hole H. In this specification, hole H may be a well, a shaft, an opening, etc. that extends vertically through the stacked structure. Specifically, the hole H may be formed by etching the interlayer insulating layers ILD between the word lines 110.

In an example, the hole H may be formed to a depth that exposes the substrate 100, where a bottom surface of hole H is lower than a bottom surface of the word lines 110-1 of the first layer. Also, the hole H may be formed such that portions of the word lines 110 common to the hole H and positioned along the second direction are exposed in the sidewalls of hole H. Thus methods of fabricating embodiments of the semiconductor memory devices include controlling etching an etching method of the hole H to provide a required or predetermined width or diameter.

Figure 2C:
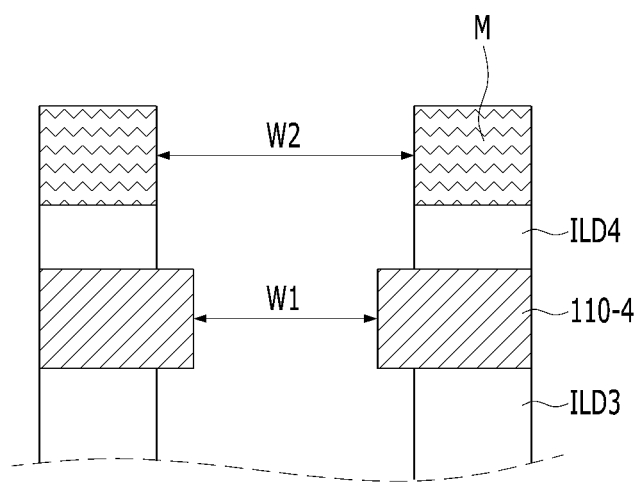

In an embodiment, the hole H is illustrated as having a constant width in a vertical direction, but in other embodiments, the width is not constant and other configurations are possible. For example, as illustrated in FIG. 2C, a mask pattern M having a substantially circular opening (in a planar view) that exposes hole H in a region between the word lines 110 may be formed over the fourth interlayer insulating layer ILD4. Here, a width or diameter W2 of the opening of the mask pattern M may be greater than a distance W1 between the word lines 110. Subsequently, the hole H may be further formed by anisotropically etching the interlayer insulating layers ILD using the mask pattern M as an etching barrier. The etching process for forming the hole H may be performed using an etching gas, such as for example an oxide, that selectively etches interlayer insulating layers ILD. Accordingly, the hole H may have a second width or diameter W2 in the interlayer insulating layers ILD, and a first width or diameter W1 between the word lines 110 is smaller than the second width W2 in the same word line layer. Thus, the portions of word lines 110 in the word line layer exposed in the hole H protrude in an inward direction in the hole H. The additional surface area in the hole H increases contact with a variable resistance layer, which will be described later, resulting in a more robust and reliable memory device. In another embodiment, during the manufacturing process, even when the hole H is formed using a mask pattern having an opening having a diameter that is substantially the same as the distance W1 between the word lines 110, the interlayer insulating layers ILD and/or the word lines 110 common to the sidewalls may be further etched using an isotropic etching gas during the formation of the hole H, or after the formation of the hole H. The structure is similar to that described above in which a contact area between the word lines 110 and a variable resistance layer, which will be described later, is increased compared with a hole H with a constant width in the vertical direction.

Referring to FIG. 2A, the holes H may have a matrix-like arrangement with three holes spaced apart in a first direction, where each of the three holes are part of another three holes spaced apart in a second direction. In this example, a three by three (3×3) matrix of holes H, disposed along the first direction and the second direction, is illustrated. However, embodiments contemplated by the present disclosure may have different numbers of holes H arranged along the first and second directions to form N×M matrix arrangements, where N and M are each integers greater than 1.

Figure 3A:
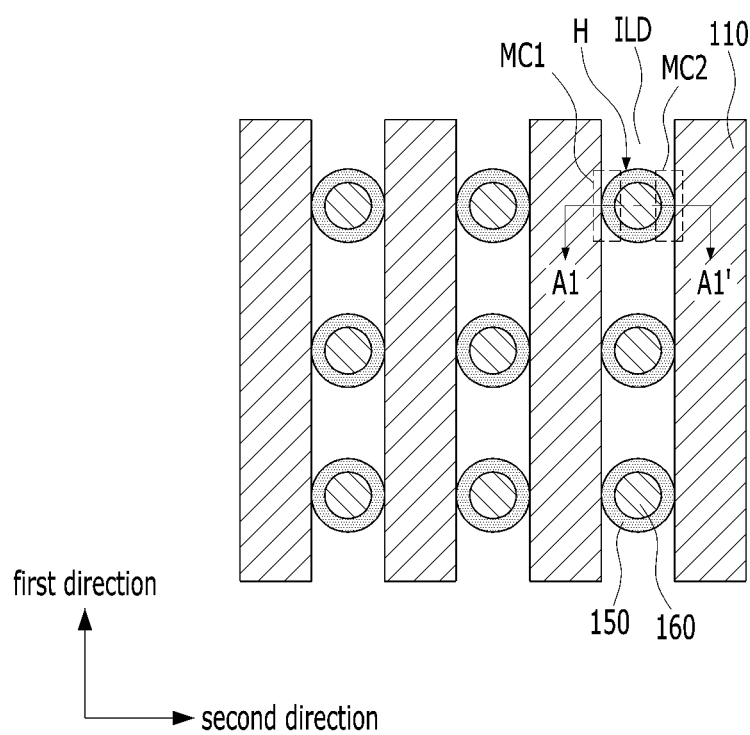
Figure 3B:
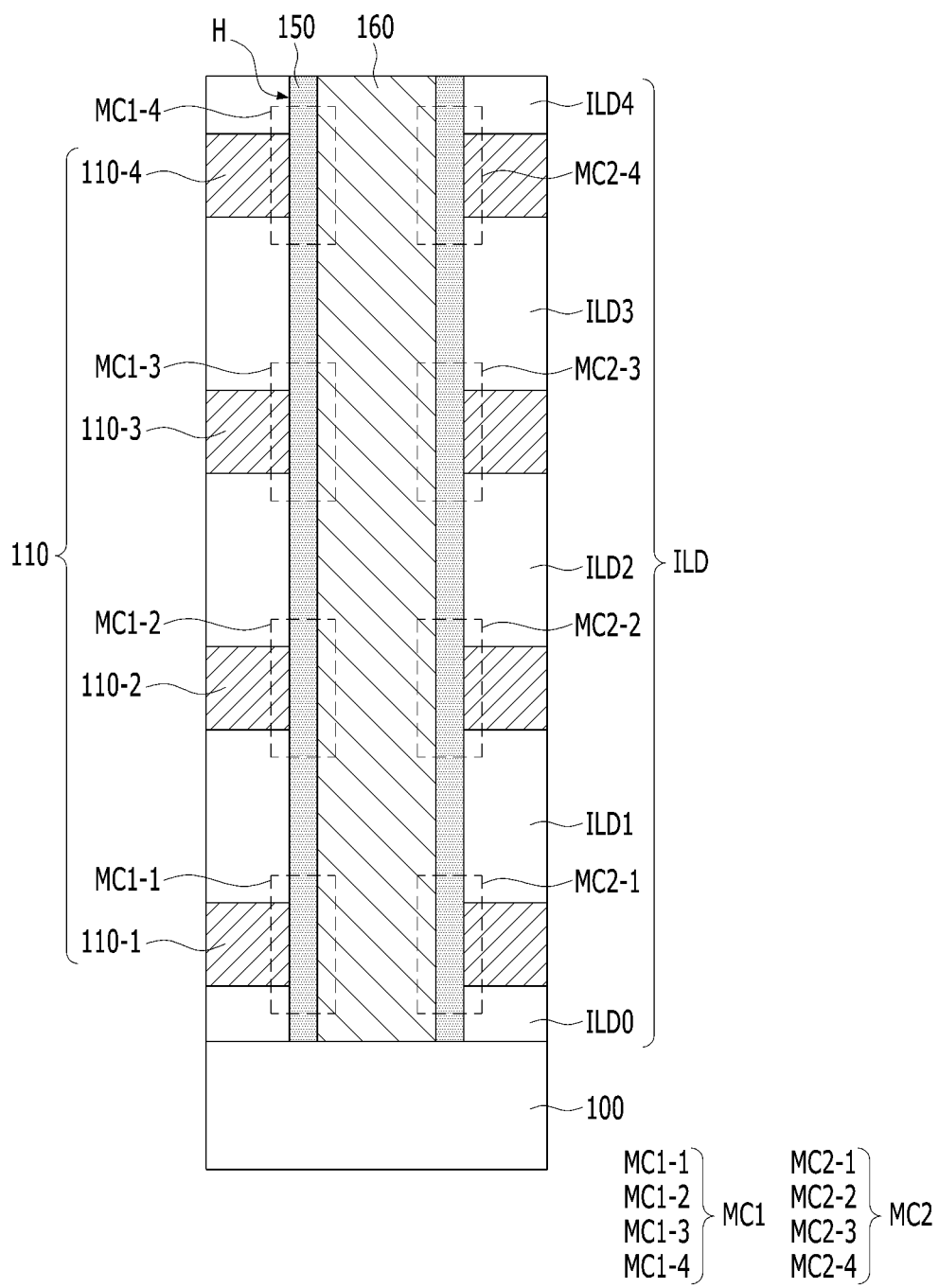

Referring to FIGS. 3A and 3B, a variable resistance layer 150 may be formed on the sidewalls of the hole H. In some embodiments, variable resistance layer 150 may be further formed at the bottom of hole H.

The variable resistance layer 150 may have variable resistance characteristics which allow switching between different resistances states according to variations in applied voltages or current. The variable resistance layer 150 may have a single-layered structure or a multi-layered structure with a combination of more than two layers that shows variable resistance characteristics. When the variable resistance layer 150 has a multi-layered structure, each layer included in the variable resistance layer 150 may extend in the vertical direction. For example, a multi-layered structure may have concentric layers that form variable resistance layer 150. The variable resistance layer 150 may include a material used in an RRAM, a PRAM, an FRAM or an MRAM, such as, for example, a metal oxide such as a transition metal oxide or a perovskite-based material, a phase-change material such as a chalcogenide-based material, a ferroelectric material, a ferromagnetic material and the like.

The variable resistance layer 150 may be formed such that it does not fill the hole H. The variable resistance layer 150 may be formed by depositing a single layer or multiple layers along an inner wall of the hole H and performing a blanket etching process. Accordingly, the variable resistance layer 150 may have a cylindrical or tubular shape extending in the vertical direction. In some embodiments, the blanket etching process may be omitted and the variable resistance layer 150 in this case may remain deposited on a bottom surface of the hole H.

Subsequently, a bit line 160 may be formed to fill the hole H in which the variable resistance layer 150 is formed.

The bit line 160 may include various conductive materials such as metal, metal nitride, or a combination thereof, and may have a pillar-like shape extending in the vertical direction. The bit line 160 may be formed by depositing a conductive material sufficient to fill the hole H in which the variable resistance layer 150 is already formed, and then performing a planarization process until the fourth interlayer insulating layer ILD4 is exposed.

In this way, a memory device as shown in FIGS. 3A and 3B may be obtained.

Referring again to FIGS. 3A and 3B, in an embodiment, a memory device may include a memory cell with a bit line 160 extending in the vertical direction and having a column-like or pillar-like shape, a word line 110 of a word line layer disposed at one side and the other side of the bit line 160, and a variable resistance layer 150 interposed between the bit line 160 and the word line 110. As seen in FIG. 3B, a variable resistance layer 150 may be in contact with two word lines in any given word line layer. In this example illustrated in FIG. 3B, there are four word line layers spaced apart or stacked in the vertical direction, resulting in vertically spaced apart or stacked memory cells.

The bit lines 160 may be arranged in a matrix aligned to the first direction and the second direction. The bit lines 160 arranged in a line in the first direction may be referred to as a column of the bit lines 160. The word lines 110 of the four layers may be disposed at both sides of each of the bit lines 160 in the column. Two columns of the bit lines 160 adjacent to and spaced apart from each other in the second direction may share the same word lines 110 of the four layers of word lines. In addition, a variable resistance layer 150 may have a shape extending in the vertical direction and surrounding each bit line 160.

A bit line 160, a word line 110, either positioned at one side or the other side of the bit line 160, and a variable resistance layer 150 therebetween may form a memory cell. Accordingly, in an example as illustrated in FIG. 3B with four word line layers, two memory cells may be formed in a word line layer at both sides of the bit line 160. The two memory cells in a word line layer are spaced apart in the second direction. Two memory cells on either side of bit line 160 may be referred to as a first memory cell and a second memory cell. For example, the cross section view of the A1-A1' line from FIG. 3A shows memory cells MC1-1, MC1-2, MC1-3 and MC1-4 common to or corresponding to the word lines 110-1, 110-2, 110-3 and 110-4 respectively of the first to fourth word line layers at one side of the bit line 160. Similarly, memory cells MC2-1, MC2-2, MC2-3 and MC2-4 are common to or corresponding to the word lines 110-1, 110-2, 110-3 and 110-4 respectively of the first to fourth word line layers at the other side of the bit line 160. First memory cells MC1-1, MC1-2, MC1-3 and MC1-4 may collectively be designated MC1, and second memory cells MC2-1, MC2-2, MC2-3 and MC2-4 may collectively be designated MC2. Referring again to FIG. 3B, each memory cell of MC1 and MC2 include a portion of a word line, a portion of a variable resistance layer 150 and a portion of bit line 160.

In a memory cell, a resistance of a portion of the variable resistance layer 150 between the bit line 160 and the word line 110 may be changed by changing a voltage or a current applied to the corresponding bit line 160 and the word line 110 in response to an operation such as a write or program operation. For example, referring to FIG. 3B, in a program operation for changing a resistance of the first memory cell MC1-1 of the first layer, a program voltage may be applied through the bit line 160 and a word line 110-1 of the first layer. Accordingly, a resistance of a portion of the variable resistance layer 150 between the bit line 160 and a word line 110-1 of the first layer, may be changed.

As an example, the variable resistance layer 150 may include a metal oxide whose resistance is changed by generation or disappearance of a current path due to a behavior of oxygen vacancies. In this example, when a current path in a direction parallel to the surface of the substrate 100 is generated in a corresponding portion of the variable resistance layer 150, the memory cell may have a low resistance state, and when the current path disappears, the memory cell may have a high resistance state. In another example, the variable resistance layer 150 may include a phase change material whose resistance changes according to a crystalline state or an amorphous state. In this instance, when a corresponding portion of the variable resistance layer 150 is in a crystalline state, the memory cell may have a low resistance state, and when the corresponding portion of the variable resistance layer 150 is in an amorphous state, the memory cell may have a high resistance state.

In an embodiment, lines parallel to the surface of the substrate 100 may be referred to as word lines 110, and a column-shaped line extending in a direction perpendicular to the substrate 100 may be referred to as a bit line 160. In another embodiment, a line parallel to the surface of the substrate 100 may be referred to as a bit line, and a column-shaped line extending in a direction perpendicular to the substrate 100 may be referred to as a word line.

In embodiments disclosed herein, memory cells may be formed on more than one side of a bit line in a word line layer, and more than one word line layer may be stacked or spaced apart in a vertical direction. As a result, the number of memory cells in disclosed embodiments may increase, thereby increasing the degree of integration of the memory device.

In addition, after forming the stacked structure of the word lines 110 and the interlayer insulating layers ILD, the interlayer insulating layers ILD between the word lines 110 are etched together to form the hole H, and the variable resistance layer 150 and the bit line 160 are buried in the hole H. Therefore, the process is easy and simple, and reliability and stability can be further increased by increasing the surface area of the word lines in the hole H.

Further, since the etching of the variable resistance layer 150 is not performed, there is no fear of etching damage, and thus, deterioration of characteristics of the memory cells due to etching damage may be prevented.

Figure 4A:
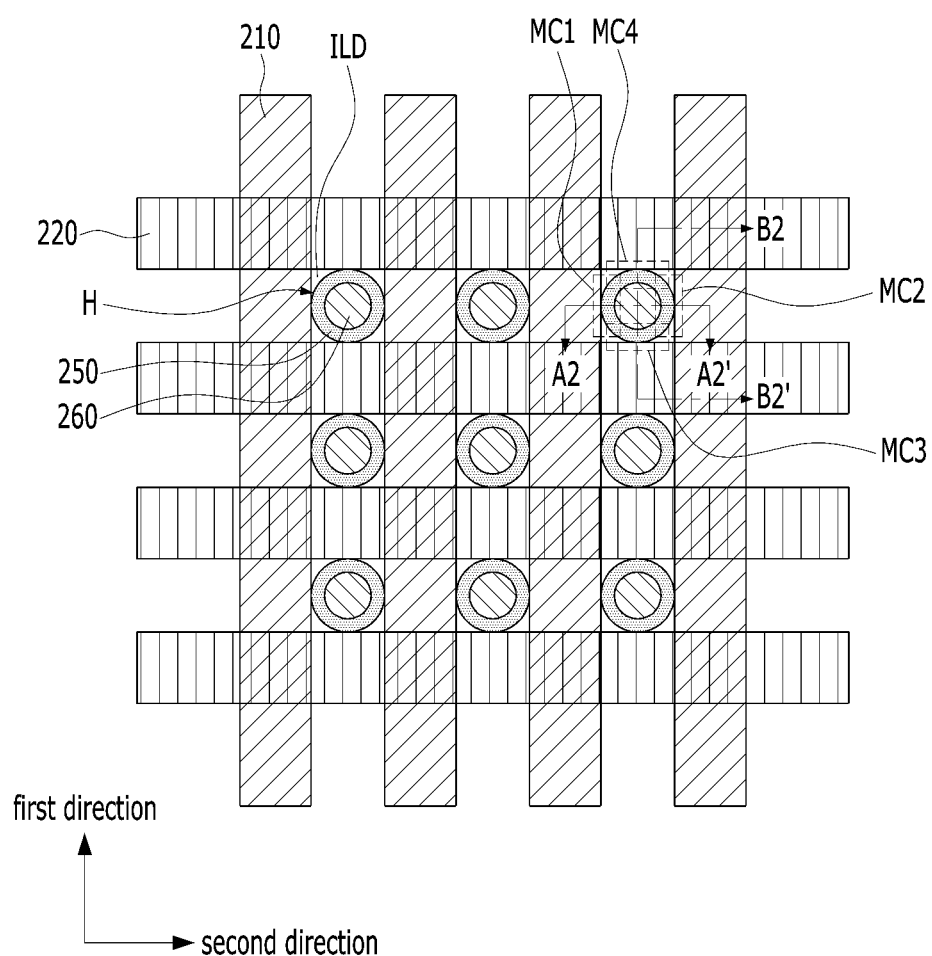
FIGS. 4A to 4C are views illustrating a semiconductor memory device and a method of fabricating the same according to an embodiment of the present disclosure.
Figure 4B:
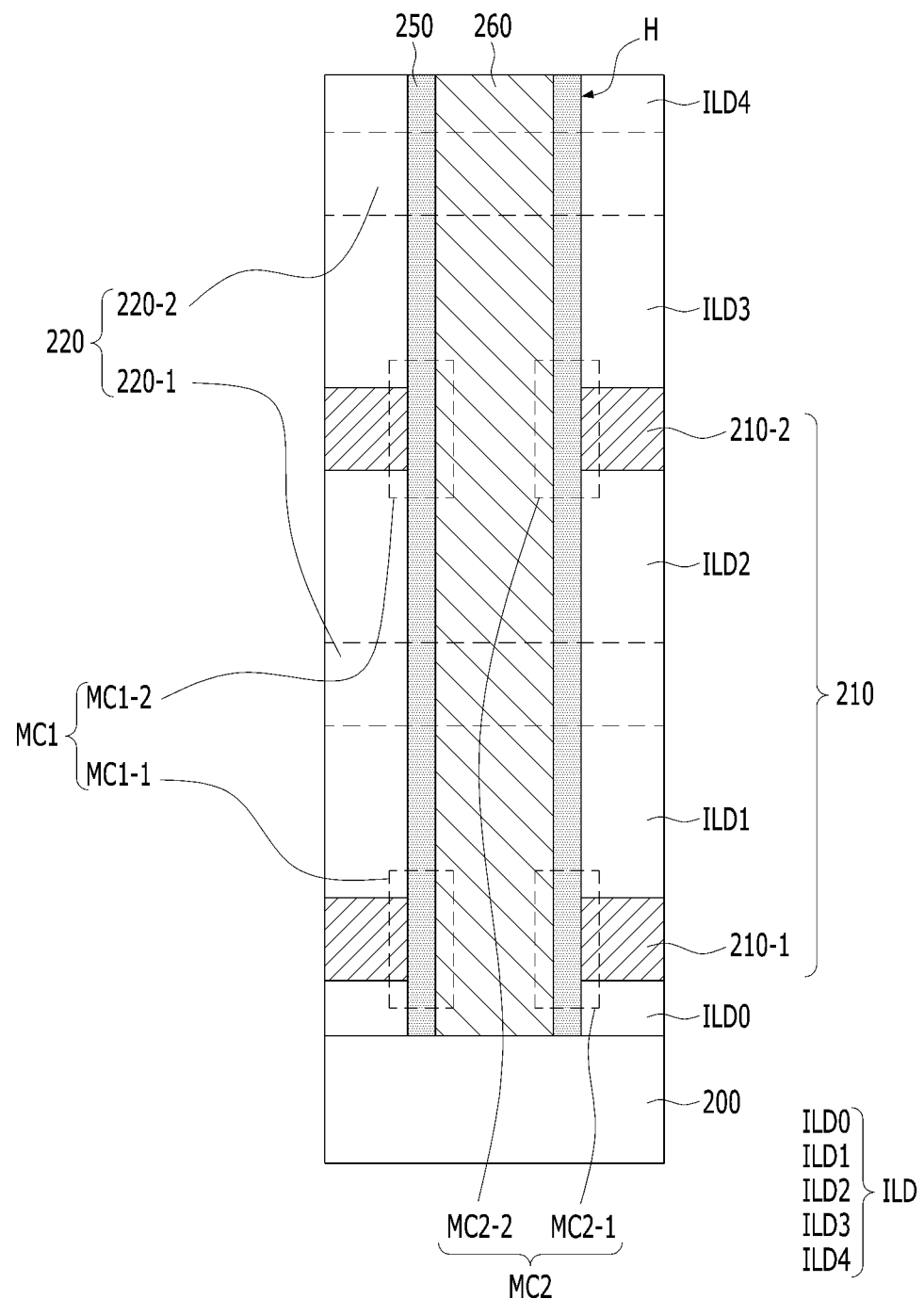
Figure 4C:
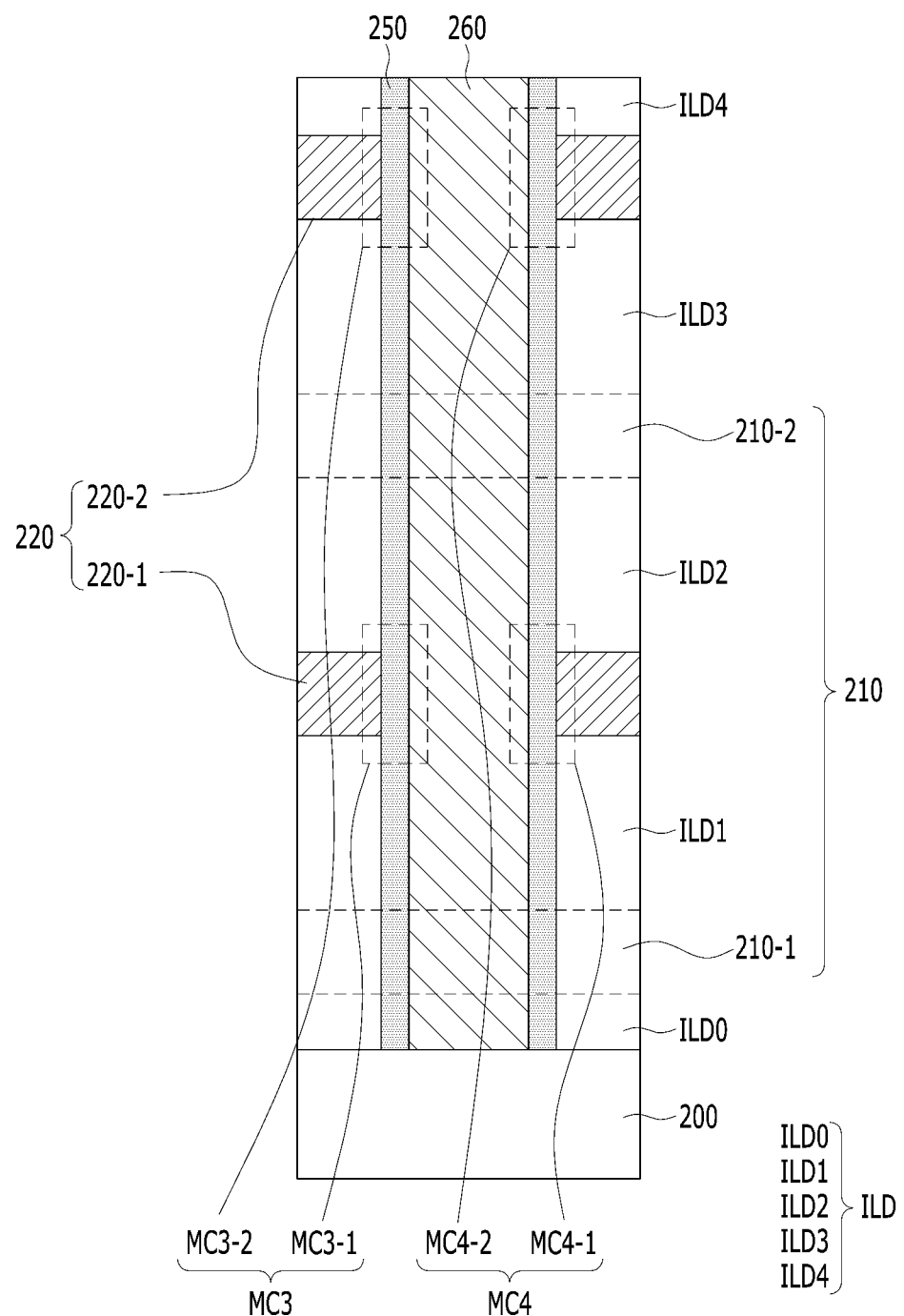

FIGS. 4A to 4C are views illustrating a semiconductor memory device and a method of fabricating the same according to an embodiment of the present disclosure. FIG. 4A shows a planar view, FIG. 4B shows a cross-sectional view taken along a line A2-A2' of FIG. 4A, and FIG. 4C shows a cross-sectional view taken along a line B2-B2' of FIG. 4A. Detailed descriptions of substantially the same elements as described above and with reference to FIGS. 1A through 3B will be omitted for the sake of clarity and for convenience.

Referring to FIGS. 4A to 4C, in an embodiment a memory device may include a bit line 260 extending in a vertical direction perpendicular to an upper surface of a substrate 200. Bit line 260 may have a columnar or pillar-like shape. Each layer of first word lines 210 include word lines 210 extending in a first direction parallel to the surface of a substrate 200, and spaced apart in a second direction. Each layer of second word lines 220 include word lines 220 extending in a second direction parallel to the surface of a substrate 200, and spaced apart in a first direction. As illustrated in FIG. 4A, in a planar view the first word lines 210 and the second word lines 220 appear to be cross-hatched. The structure of the memory device includes alternating layers of first word lines 210 and layers of second word lines 220. Alternating layers of first word lines 210 and layers of second word lines 220 may be sequentially stacked on top of or over substrate 200. The bit line 260 may be in contact with first word lines 210 and second word lines 220. For example, in FIGS. 4B and 4C, first word lines 210 may be disposed at one side and the other side of the bit line 260 in a second direction, and second word lines 220 may be disposed at one side and the other side of the bit line 260 in a first direction. The layers of word lines may be positioned at different heights from each other. At least a portion of a variable resistance layer 250 is interposed between the bit line 260 and the first the word lines 210, and between the bit line 260 and the second word lines 220 such that the variable resistance layer 250 surrounds bit line 260 and contacts first word lines 210 and second word lines 220.

The first word lines 210 may be stacked in one or more layers, or spaced apart, in the vertical direction. In an embodiment illustrated in FIG. 4B, two first word lines 210 are stacked in two different, separate layers, however, the number of layers in memory devices contemplated by the present disclosure may be one, two, or three, or more than three. For convenience of description, the first word lines 210 of the two layers may be indicated by first word lines 210-1 of a first layer and first word lines 210-2 of a second layer. The first word lines 210 of any one layer may extend in the first direction parallel to the surface of the substrate 200, and may be arranged to be spaced apart from each other in the second direction parallel to the surface of the substrate 200. In an embodiment, the number of first word lines 210 of any given layer is four, but the number may be variously modified in other embodiments contemplated by this disclosure.

The second word lines 220 may be stacked in one or more layers, or spaced apart, in the vertical direction. In an embodiment illustrated in FIG. 4C, two second word lines 220 are stacked in two different, separated layers, but the number of layers in memory devices contemplated by the present disclosure may be one, two, or three, or more than three. For convenience of description, the second word lines 220 of the two layers may be indicated by second word lines 220-1 of a first layer and second word lines 220-2 of a second layer. The second word lines 220 of any one layer may extend in the second direction to cross the first word lines 210 in a substantially perpendicular manner, and may be arranged to be spaced apart from each other in the first direction parallel to the surface of the substrate 200. In an embodiment, the number of second word lines 220 of any one layer is four, but the number may be variously modified in other embodiments contemplated by this disclosure.

The layers of first word lines 210 and the layers of second word lines 220 may be alternately arranged to be spaced apart from each other in the vertical direction. For example, the first word lines 210-1 of the first layer, the second word lines 220-1 of the first layer, the first word lines 210-2 of the second layer, and the second word lines 220-2 of the second layer may be sequentially arranged to be spaced apart from each other in the vertical direction. In an embodiment, the first layer of word lines disposed on the substrate 200 may be a layer of first word lines 210. In another embodiment, the first layer of word lines disposed on the substrate 200 may be a layer of second word lines 220.

The first word lines 210 and the second word lines 220 may be separated from each other by interlayer insulating layers ILD. As an example, the first word lines 210-1 of the first layer may be separated from each other by a first interlayer insulating layer ILD1. First interlayer insulating layer ILD1 also separates the first layer of first word lines 210-1 from the first layer of second word lines 220-1. The second word lines 220-1 of the first layer may be separated from each other by a second interlayer insulating layer ILD2. Second interlayer insulating layer ILD2 also separates the first layer of second word lines 210-1 from the second layer of first word lines 210-2. The first word lines 210-2 of the second layer may be separated from each other by a third interlayer insulating layer ILD3. Third interlayer insulating layer ILD3 also separates the second layer of first word lines 210-2 from the second layer of second word lines 220-2. The second word lines 220-2 of the second layer may be separated from each other by a fourth interlayer insulating layer ILD4. The first word lines 210 may be separated from the substrate 200 by an initial interlayer insulating layers ILD0.

In a planar view, a hole H that provides a space in which the variable resistance layer 250 and the bit line 260 are to be formed may be disposed in an area or region, substantially rectangular or square in shape, defined by the cross-hatching of first word lines 210 and second word lines 220. The hole H may be formed to expose the substrate 200 through the interlayer insulating layers ILD in a region between the first word lines 210 and between the second word lines 220.

The variable resistance layer 250 formed on a sidewall of the hole H and the bit line 260 filling the hole H in which the variable resistance layer 250 is formed may be provided or disposed in the hole H. Accordingly, the bit lines 260 may be arranged in a matrix along the first direction and the second direction. The bit lines 260 arranged in a line in the first direction may be referred to as a first column of the bit lines 260, and the bit lines 260 arranged in a line in the second direction may be referred to as a second column of the bit lines 260. As seen in FIG. 4A, the first word lines 210 may be disposed on sides of the first column of the bit lines 260 along a first direction, while second word lines 220 may be disposed at sides of the second column of the bit lines 260 in a second direction. Two first columns of the bit lines 260 adjacent to and spaced apart from each other in the second direction may share the same first word lines 210 of the two layers of first word lines. Two second columns of the bit lines 260 adjacent to and spaced apart from each other in the first direction may share the same second word lines 220 of the two layers of second word lines. The variable resistance layer 250 may have a shape extending in the vertical direction and may surround the side surfaces of the bit line 260.

A bit line 260, a first word line 210, either positioned at one side or the other side of the one bit line 260 in the second direction, or a second word line 220, either positioned at one side or the other side of the one bit line 260 in the first direction, and a variable resistance layer 250 therebetween may form a memory cell. Accordingly, in an example illustrated in FIG. 4B with two layers of first word lines, memory cells corresponding to first word line 210, that is, a first memory cell MC1 and a second memory cell MC2, may be formed at both sides of the one bit line 260 in the second direction. In an example illustrated in FIG. 4C with two layers of second word lines, two memory cells corresponding to second word line 220, that is, a third memory cell MC3 and a fourth memory cell MC4, may be formed at both sides of the one bit line 260 in the first direction. In further detail, in FIG. 4B, the bit line 260, the first word lines 210-1 and 210-2 of the first and second layers of first word lines, and portions of the variable resistance layer 250 therebetween on a first side of bit line 260 may form first memory cells MC1-1 and MC1-2. The bit line 260, the first word lines 210-1 and 210-2 of the first and second layers of first word lines at the other side of the bit line 260, and portions of the variable resistance layer 250 therebetween may form second memory cells MC2-1 and MC2-2. In further detail, in FIG. 4C, the bit line 260, the second word lines 220-1 and 220-2 of the two layers of second word lines on one side of the bit line 260, and portions of the variable resistance layer 250 therebetween may form third memory cells MC3-1 and MC3-2. The bit line 260, the second word lines 220-1 and 220-2 of the two layers of second word lines at the other side of the bit line 260, and portions of the variable resistance layer 250 therebetween may form fourth memory cells MC4-1 and MC4-2.

Consequently, a plurality of first memory cells MC1 (e.g., MC1-1 and MC1-2) may be stacked along a first side of a bit line 260, and a plurality of second memory cells MC2 (e.g., MC2-1 and MC2-2) may be stacked along a second side of the bit line 260, which is opposite to the first side. The second memory cells MC2 may be respectively positioned at the same height as the first memory cells MC1 because they may be formed on a common layer of first word lines. A plurality of third memory cells MC3 (e.g., MC3-1 and MC3-2) may be stacked along a third side of the bit line 260, which is between the first side and the second side. The third memory cells MC3 may be positioned at a different height from the first memory cells MC1 because they may be formed on different word line layers. For example, the third memory cells MC3 may be alternately stacked with the first memory cells MC1. A plurality of fourth memory cells MC4 may be stacked along a fourth side of the bit line 260, which is opposite to the third side. The fourth memory cells MC4 may be positioned at the same height as the third memory cells MC3 because they may be formed on a common layer of second word lines.

Methods of fabricating the memory device of the present embodiments may be substantially the same as the above-described embodiments, except for further forming the second word lines 220 extending in a direction different from that of the first word lines 210. That is, after forming the stacked structure of the first word lines 210, the second word lines 220 and the interlayer insulating layers ILD, the interlayer insulating layers ILD between the first word lines 210 and between the second word lines 220 are etched together to form the hole H, and the variable resistance layer 250 and the bit line 260 are buried in the hole H.

Embodiments disclosed herein include memory cells that may be formed at four sides of a single bit line, thereby further increasing the degree of integration of the memory device.

Figure 5A:
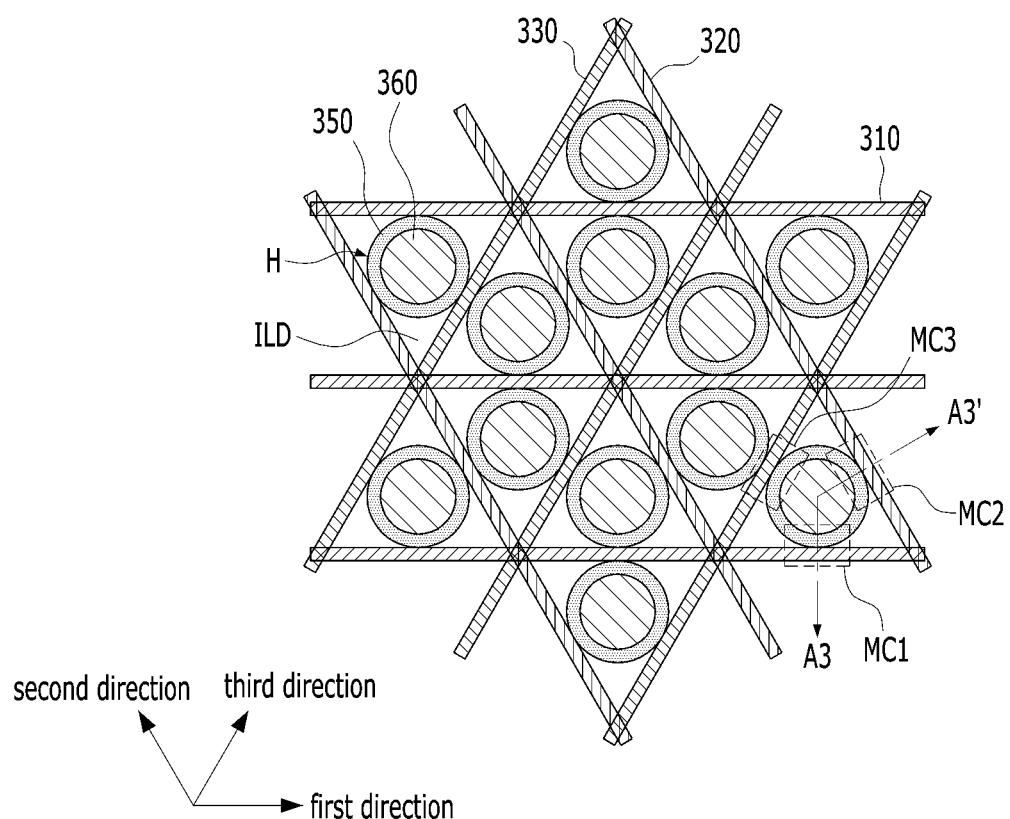
FIGS. 5A to 5C are views illustrating a semiconductor memory device and a method of fabricating the same according to an embodiment of the present disclosure.
Figure 5B:
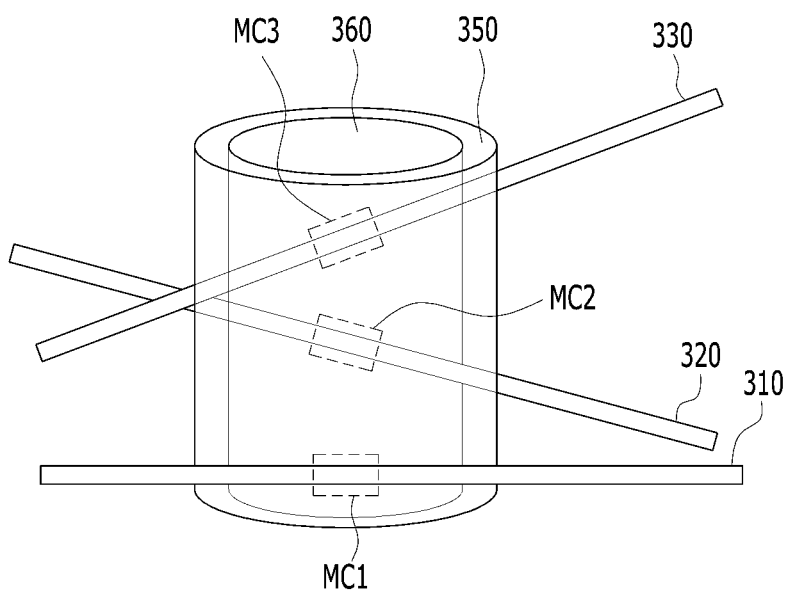
Figure 5C:
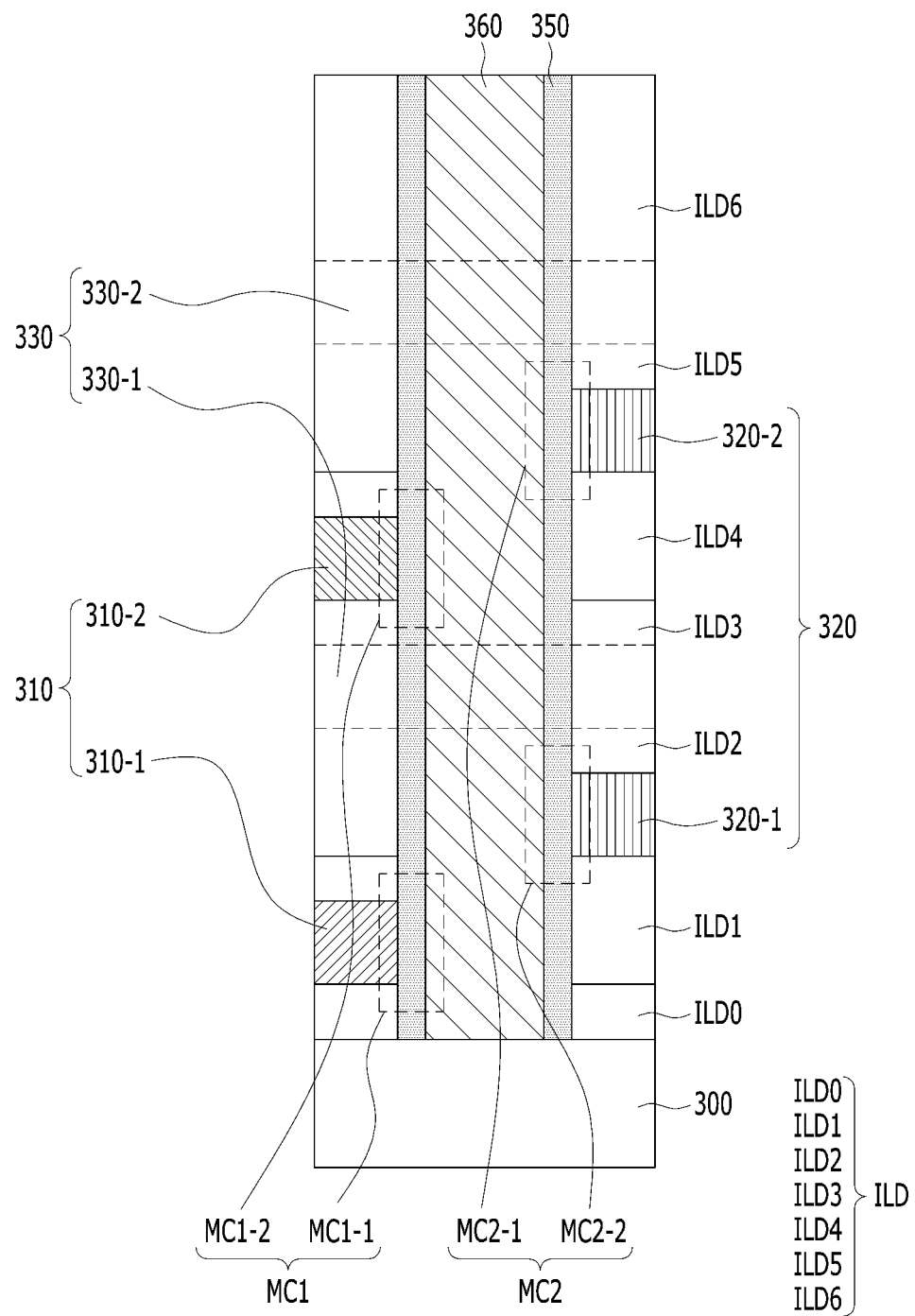

FIGS. 5A to 5C are views illustrating a semiconductor memory device and a method of fabricating the same according to an embodiment of the present disclosure. FIG. 5A shows a planar view, FIG. 5B shows a perspective view, and FIG. 5C shows a cross-sectional view taken along a line A3-A3' of FIG. 5A.

Referring to FIGS. 5A to 5C, in an embodiment a memory device may include a bit line 360 extending in a vertical direction perpendicular to a surface of a substrate 300 and having a columnar or pillar-like shape, first word lines 310 extending in a first direction and disposed at a first side of the bit line 360, second word lines 320 extending in a second direction and disposed at a second side of the bit line 360, and third word lines 330 extending in a third direction and disposed at a third side of the bit line 360. The first direction, second direction and third direction cross each other and are at angles to each other. For example, in a planar view, the first direction, second direction and third direction may be at sixty (60) degree angles relative to each other. Other angles, however, may be selected. Each set of first word lines 310, second word lines 320 and third word lines 330 first direction, second direction and third direction are formed in word line layers, with each layer of first word lines 310, second word lines 320 and third word lines 330 positioned at heights different from each other. The memory device may include a variable resistance layer 350 interposed between the bit line 360 and the first word lines 310, between the bit line 360 and the second word lines 320, and between the bit line 360 and the third word lines 330 such that the variable resistance layer 350 surrounds bit line 360 and contacts the first word lines 310, the second word lines 320, and the third word lines 330.

The first word lines 310 may be stacked in one or more layers, and the layers may be spaced apart, in the vertical direction. For example, in FIG. 5C, the first word lines 310 are stacked in two separated layers, but the number of layers of the first word lines 310 in memory devices contemplated by the present disclosure may be one, two, or three, or more than three. For convenience of description, the first word lines 310 of the two layers may be indicated by first word lines 310-1 of a first layer and first word lines 310-2 of a second layer according to a distance from the substrate 300. The first word lines 310 of any one layer may extend in the first direction parallel to the surface of the substrate 300, and may be arranged to be spaced apart from each other in a direction that is parallel to the surface of the substrate 300 and that is substantially perpendicular to the first direction. In an embodiment, the number of the first word lines 310 of any given layer of the first word lines is three, but the number may be variously modified in other embodiments contemplated by this disclosure.

The second word lines 320 may be stacked in one or more layers, and the layers may be spaced apart, in the vertical direction. For example, in FIG. 5C, the second word lines 320 are stacked in two separated layers, but the number of layers of the second word lines 320 in memory devices contemplated by the present disclosure may be one, two, or three, or more than three. For convenience of description, the second word lines 320 of the two layers may be indicated by second word lines 320-1 of a first layer and second word lines 320-2 of a second layer according to a distance from the substrate 300. The second word lines 320 of any one layer may extend in the second direction parallel to the surface of the substrate 300, and may be arranged to be spaced apart from each other in a direction that is parallel to the surface of the substrate 300 and that is substantially perpendicular to the second direction. The second direction may be a direction that is at an angle to the first direction, and the angle between the first direction and the second direction is not perpendicular (e.g. not ninety (90) degrees). For example, the angle formed by the second direction and the first direction may be about 120 degrees. In an embodiment, the number of the second word lines 320 of any given layer of the second word lines is three, but the number may be variously modified in other embodiments contemplated by this disclosure.

The third word lines 330 may be stacked in one or more layers, and the layers may be spaced apart, in the vertical direction. For example, in FIG. 5C, the third word lines 330 are stacked in two separated layers, but the number of layers of the third word lines 330 in memory devices contemplated by the present disclosure may be one, two, three, or three or more than three. For convenience of description, the third word lines 330 of the two layers may be indicated by third word lines 330-1 of a first layer and third word lines 330-2 of a second layer according to a distance from the substrate 300. The third word lines 330 of any one layer may extend in a third direction parallel to the surface of the substrate 300, and may be arranged to be spaced apart from each other in a direction that is parallel to the surface of the substrate 300 and that is perpendicular to the third direction. The third direction may be a direction that is at an angle to the first and second directions. The angle between the third direction and the first direction is not perpendicular (e.g. not ninety (90) degrees), and the angle between the third direction and the second direction is also not perpendicular. For example, each of an angle formed by the third direction and the first direction and an angle formed by the third direction and the second direction may be about sixty (60) degrees. In an embodiment, the number of the third word lines 330 of any given layer of the third word lines is three, but the number may be variously modified in other embodiments contemplated by this disclosure.

In an embodiment, the first word lines 310, the second word lines 320 and the third word lines 330 may be sequentially arranged to be stacked or spaced apart from each other in the vertical direction. Also, a layer of the first word lines 310, a layer of second word lines 320 and a layer of third word lines 330 may be arranged repeatedly in the vertical direction, or sequentially stacked on each other in the vertical direction. For example, the following layers of word lines may be sequentially arranged or stacked in the vertical direction: the first layer of first word lines 310-1, the first layer of second word lines 320-1, the first layer of third word lines 330-1, the second layer of first word lines 310-2, the second layer of second word lines 320-2, and the second layer of third word lines 330-2. In the above example, the first layer of first word lines 310-1 may be disposed directly on an upper surface of substrate 300 in the vertical direction. Also, the layers of the first word lines 310, the second word lines 320 and the third word lines 330 may be arranged at different relative heights in the vertical direction within the layered structure. For example, the first layer of first word lines 310-1 may be located at the top, the first layer of second word lines 320-1 may be located in the middle, and the first layer of the third word lines 330-1 may be located in the bottom of the structure, which is disposed on the substrate 300. However, this stacking order in the vertical direction may be changed and modified in embodiments contemplated by the disclosure.

The first word lines 310 to the third word lines 330 may be separated from each other by interlayer insulating layers ILD. As an example, the first word lines 310-1 of the first layer may be separated from each other and from second word lines 320-1 of the first layer by a first interlayer insulating layer ILD1 that covers first word lines 310-1. The second word lines 320-1 of the first layer may be separated from each other and from third word lines 330-1 of the first layer by a second interlayer insulating layer ILD2 that covers second word lines 320-1. The third word lines 330-1 of the first layer may be separated from each other and from the first word lines 310-2 of the second layer by a third interlayer insulating layer ILD3 that covers third word lines 330-1 of the first layer. The first word lines 310-2 of the second layer may be separated from each other and from the second word lines 320-2 of the second layer by a fourth interlayer insulating layer ILD4 that covers first word lines 310-2 of the second layer. The second word lines 320-2 of the second layer may be separated from each other and from the third word lines 330-2 of the second layer by a fifth interlayer insulating layer ILD5 that covers second word lines 320-2 of the second layer. The third word lines 330-2 of the second layer may be separated from each other by a sixth interlayer insulating layer ILD6.

In a planar view, a hole H that provides a space in which the variable resistance layer 350 and the bit line 360 are to be formed may be disposed in an area or region of a roughly triangular shape defined by the first word lines 310, the second word lines 320 and the third word lines 330. The hole H may be formed to expose the substrate 300 through the interlayer insulating layers ILD in a region surrounded by a first word line 310, a second word line 320 and a third word line 330.

The variable resistance layer 350 formed on a sidewall of the hole H and the bit line 360 filling the hole H in which the variable resistance layer 350 is formed may be provided or disposed in the hole H. Referring to FIG. 5A, the bit line 360 may be disposed between two first word lines 310 in a direction perpendicular to the first direction and may be located in order to form a memory cell with one of the two first word lines 310. Also, the bit line 360 may be disposed between two second word lines 320 in a direction perpendicular to the second direction and may be located in order to form a memory cell with one of the two second word lines 320. Also, the bit line 360 may be disposed between two third word lines 330 in a direction perpendicular to the third direction and may be located in order to form a memory cell with one of the two third word lines 330. In addition, the variable resistance layer 350 may have a cylindrical or tubular shape, extending in the vertical direction, which surrounds the outer surface of the bit line 360.

A bit line 360, a first word line 310 positioned at a first side of the bit line 360, and the variable resistance layer 350 therebetween may form a memory cell MC1. The bit line 360, a second word line 320 positioned at a second side of the bit line 360, and the variable resistance layer 350 therebetween may form a memory cell MC2. The bit line 360, a third word line 330 positioned at a third side of the bit line 360, and the variable resistance layer 350 therebetween may form a memory cell MC3. In the example illustrated in FIG. 5C, the bit line 360, the first layer of first word lines 310-1 and the second layer of first word lines 310-2 at the first side of the bit line 360, and the variable resistance layer 350 therebetween, may form first memory cells MC1-1 and MC1-2 of the first and second layers, respectively. The bit line 360, the first layer of second word lines 320-1 and the second layer of second word lines 320-2 at the second side of the bit line 360, and the variable resistance layer 350 therebetween, may form second memory cells MC2-1 and MC2-2, respectively. Similarly, the bit line 360, the first layer of third word lines 330-1 and the second layer of third word lines 330-2 at the third side of the bit line 360, and the variable resistance layer 350 therebetween, may form third memory cells MC3-1 and MC3-2 of the first and second layers, respectively.

In summary, a plurality of first memory cells MC1 may be stacked, and spaced apart, along a first side of one bit line 360, a plurality of second memory cells MC2 may be stacked, and spaced apart, along a second side of the one bit line 360, and a plurality of third memory cells MC3 may be stacked, and spaced apart, along a third side of the one bit line 360. The component memory cells of first memory cells MC1, second memory cells MC2 and third memory cells MC3 may be located at different heights relative to each other.

Methods of fabricating memory devices of the present disclosure may be substantially the same as the above-described embodiments, except for forming the first to third word lines 310, 320 and 330, which extend in different directions. That is, after forming the stacked structure of the first word lines 310, the second word lines 320, the third word lines 330 and the interlayer insulating layers ILD, the interlayer insulating layers ILD of a triangular region defined (in a planar view) by the first word line 310, the second word line 320 and the third word line 330 are etched together to form the hole H, and the variable resistance layer 350 and the bit line 360 are buried in the hole H.

In embodiments of the disclosure, word lines extending in different directions may be formed, and memory cells may be formed at three sides of or three areas of contact with one bit line, which is disposed in a region defined by these word lines, further increases the degree of integration of the memory device.

Figure 6A:
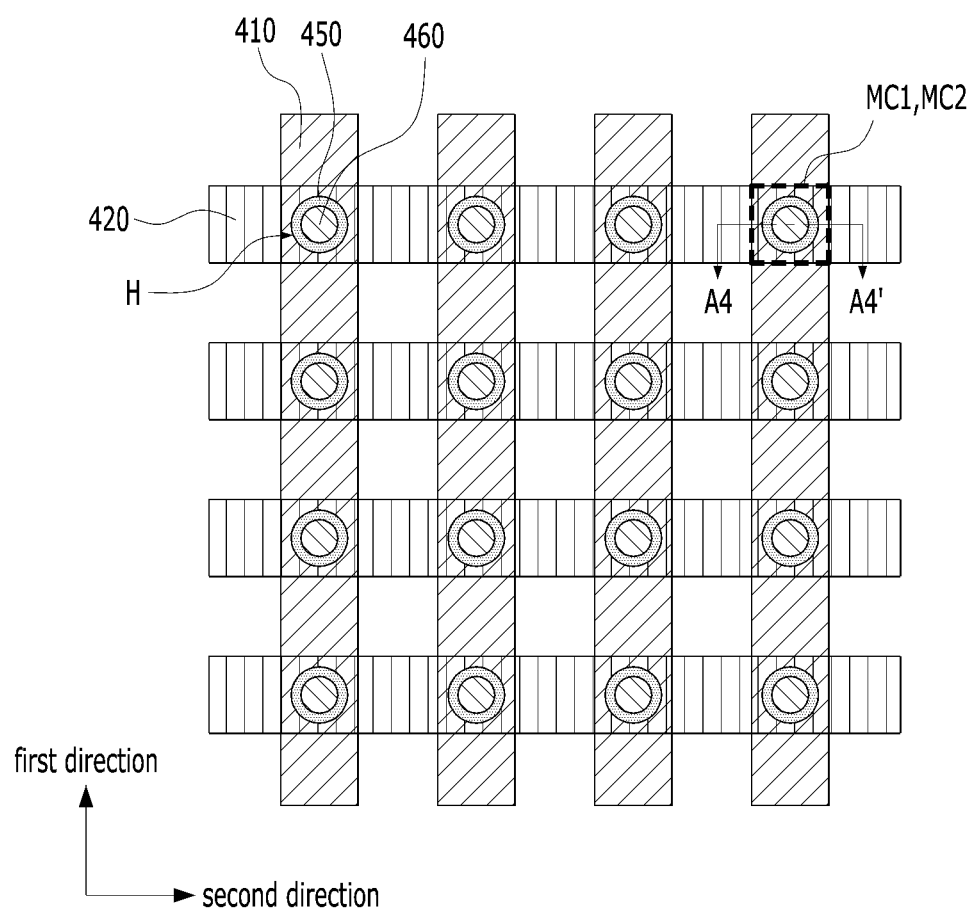
FIGS. 6A and 6B are views illustrating a semiconductor memory device and a method of fabricating the same according to an embodiment of the present disclosure.
Figure 6B:
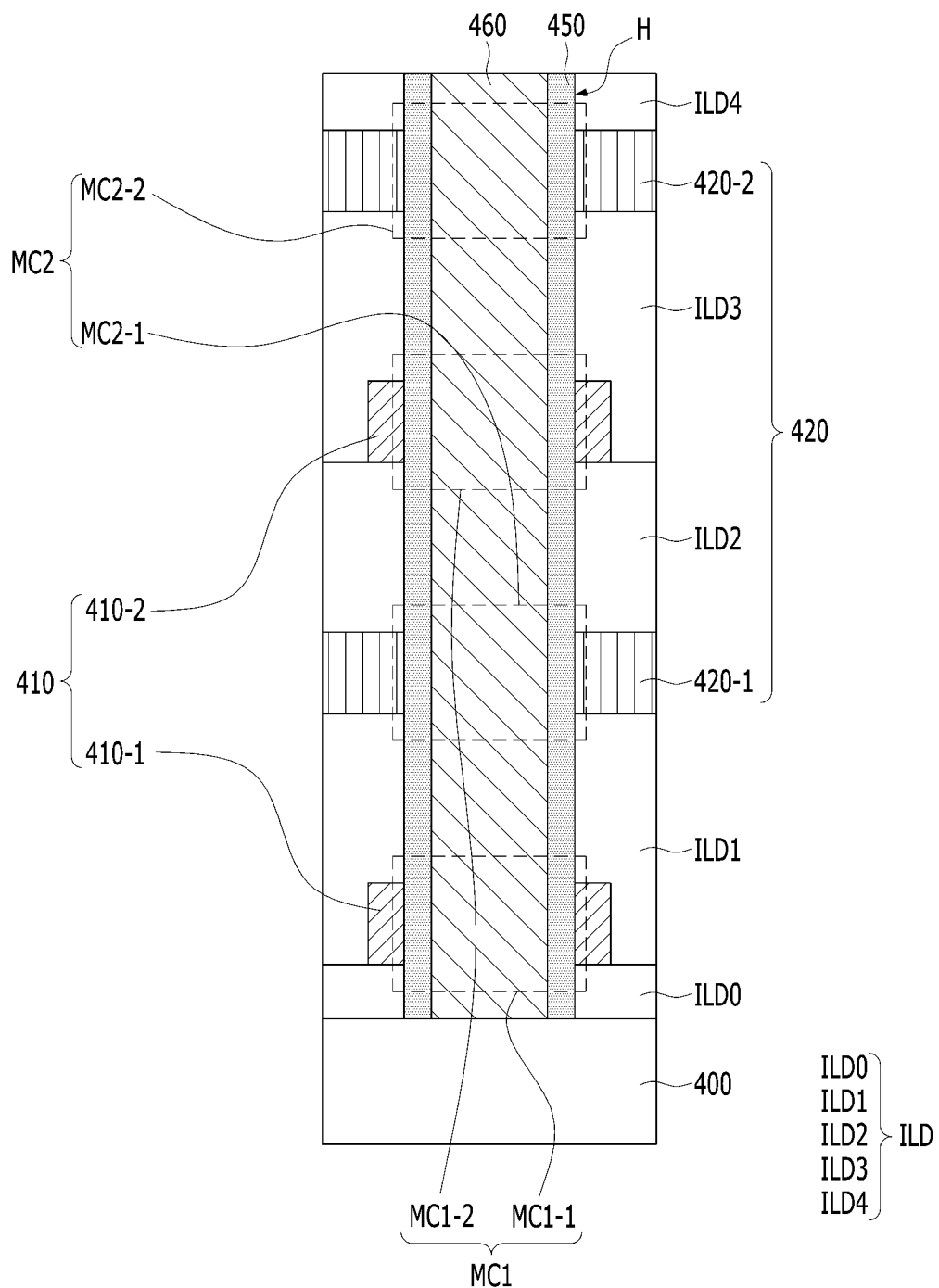

FIGS. 6A and 6B are views illustrating a semiconductor memory device and a method of fabricating the same according to an embodiment of the present disclosure. FIG. 6A shows a planar view, and FIG. 6B shows a cross-sectional view taken along a line A4-A4' of FIG. 6A.

Referring to FIGS. 6A and 6B, in an embodiment a memory device may include first word lines 410 stacked in one or more spaced apart layers, for example, in two layers and extending in a first direction, with the word lines arranged to be spaced apart from each other in a second direction. The memory device may further include second word lines 420 stacked in one or more spaced apart layers, for example, in two layers and extending in the second direction, with the word lines arranged to be spaced apart from each other in the first direction. In addition, the memory device may include a bit line 460 with a columnar or tubular geometry that extends in a vertical direction and penetrates the first and second word lines 410 and 420, and a variable resistance layer 450 interposed between the bit line 460 and the first the word lines 410, and between the bit line 460 and the second word lines 420.

In some embodiments, the first word lines 410 are stacked vertically in two separated layers, but the number of layers of the first word lines 410 may be one, two, or three, or more than three. For convenience of description, the first word lines 410 of the two layers may be designated first word lines 410-1 of a first layer and first word lines 410-2 of a second layer, according to each layer's distance from the substrate 400.

Also, in some embodiments, the second word lines 420 are stacked vertically in two separated layers, but the number of layers of the second word lines 420 may be one, two, or three, or more than three. For convenience of description, the second word lines 420 of the two layers may be designated second word lines 420-1 of a first layer and second word lines 420-2 of a second layer, according to each layer's distance from the substrate 400.

The layers of first word lines 410 and the layers of second word lines 420 may be alternately arranged to be spaced apart from each other in the vertical direction. For example, the first word lines 410-1 of the first layer, the second word lines 420-1 of the first layer, the first word lines 410-2 of the second layer, and the second word lines 420-2 of the second layer may be sequentially arranged to be spaced apart from each other in the vertical direction. In an embodiment, the first layer of word lines disposed on the substrate 400 may be a layer of first word lines 410. In another embodiment, the first layer of word lines disposed on the substrate 400 may be a layer of second word lines 420.

The first word lines 410 and the second word lines 420 may be separated from each other by interlayer insulating layers ILD. As an example, the first word lines 410-1 of the first layer may be separated from each other by a first interlayer insulating layer ILD1. First interlayer insulating layer ILD1 also separates the first layer of first word lines 410-1 from the first layer of second word lines 420-1. The second word lines 420-1 of the first layer may be separated from each other by a second interlayer insulating layer ILD2. Second interlayer insulating layer ILD2 also separates the first layer of second word lines 410-1 from the second layer of first word lines 410-2. The first word lines 410-2 of the second layer may be separated from each other by a third interlayer insulating layer ILD3. Third interlayer insulating layer ILD3 also separates the second layer of first word lines 410-2 from the second layer of second word lines 420-2. The second word lines 420-2 of the second layer may be separated from each other by a fourth interlayer insulating layer ILD4. The first word lines 410 may be separated from the substrate 400 by an initial interlayer insulating layers ILD0. As illustrated in FIG. 6A, in a planar view the first word lines 410 and the second word lines 420 appear to be cross-hatched.

Unlike the above-described implementations illustrated in FIGS. 1A through 5C, in a planar view, a hole H may overlap or be disposed in an intersection area of the first word line 410 and the second word line 420. The hole H may penetrate the first word lines 410, the second word lines 420 and the interlayer insulating layers ILD therebetween in a vertical direction. The hole H may penetrate through the stacked structure into substrate 400.

The variable resistance layer 450 formed over a sidewall of the hole H and the bit line 460 filling the hole H in which the variable resistance layer 450 is formed may be provided in the hole H. Accordingly, the bit lines 460 may be arranged in a matrix along the first direction and the second direction because the bit lines penetrate the intersection regions of the first word lines 410 and the second word lines 420.

A bit line 460, a first word line 410 surrounding the bit line 460, and the variable resistance layer 450 therebetween may form a first memory cell MC1. The bit line 460, a second word line 420 surrounding the bit line 460, and the variable resistance layer 450 therebetween may form a second memory cell MC2. The first memory cell MC1 may include first memory cell MC1-1 common to the first layer of first word lines and MC1-2 common to the second layer of first word line. Memory cells MC1-1 and MC1-2 are vertically stacked and separated in the vertical direction. The second memory cell MC2 may include second memory cell MC2-1 common to the first layer of second word lines and MC2-2 common to the second layer of second word lines. Memory cells MC2-1 and MC2-2 are vertically stacked and separated in the vertical direction. Because the memory cells MC1-1, MC1-2, MC2-1 and MC2-2 are common to different layers of first and second word lines that are sequentially stacked with interlayer insulating layer ILD, the memory cells are separated in the vertical direction and are positioned at different vertical heights above substrate 400.

The memory device of the present embodiments may be fabricated by forming a stacked structure of the first word lines 410, the second word lines 420 and the interlayer insulating layers ILD, forming the hole H in the intersection area of the first word lines 410 and the second word lines 420, and forming the variable resistance layer 450 and the bit line 460 in the hole H.

Meanwhile, in the above-described embodiments, only the variable resistance layer separates the bit line and the word line, but various material layers for process improvement or for improving different memory cell characteristics may be further interposed, together with the variable resistance layer, between the bit line and the word line. As an example, a selection element layer may be further interposed between the bit line and the word line. This will be described by way of example with reference to FIG. 7.

Figure 7:
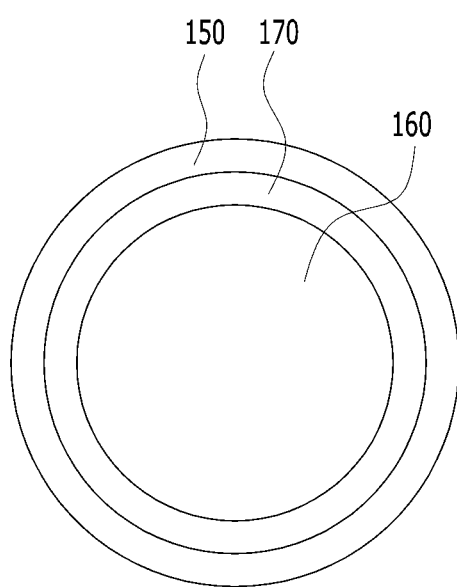
FIG. 7 is a planar view illustrating a semiconductor memory device according to an embodiment of the present disclosure.

FIG. 7 is a planar view illustrating a semiconductor memory device according to an embodiment of the present disclosure.

Referring to FIG. 7, a selection element layer 170 may be further interposed between a variable resistance layer 150 and a bit line 160. Accordingly, the selection element layer 170 may have a cylindrical shape surrounding a side or outer surface of the bit line 160. However, in another implementation, the selection element layer 170 may be interposed between the variable resistance layer 150 and the word line (not shown). In this case, the selection element layer 170 may have a cylindrical shape that surrounds an outer surface of the variable resistance layer 150, that is, a side opposite to a side facing the bit line 160.

The selection element layer 170 may control an access to the variable resistance layer 150 from the bit line 160 or the word line (not shown). To this end, the selection element layer 170 may substantially block a current flow when a level of an applied voltage or current is equal to or lower than a certain threshold value, and allow a current flow when the level of the applied voltage or current is higher than the certain threshold value. In the latter situation, the current flow may sharply increase in substantially in proportion to a magnitude of the applied voltage or current. Selection element layer 170 may be a Metal-Insulator-Transition (MIT) device such as $NbO_2$ or $TiO_2$, a Mixed Ion-Electron Conducting (MIEC) device such as $ZrO_2(Y_2O_3)$, $Bi_2O_3$—BaO, or $(La_2O_3)x(CeO_2)1-x$, an Ovonic Threshold Switching (OTS) device including a chalcogenide-based material such as $Ge_2Sb_2Te_5$, $As_2Te_3$, $As_2$ or $As_2Se_3$, or a tunneling insulating layer that is formed of a thin film including various insulating materials, e.g., a silicon oxide, a silicon nitride, a metal oxide and so forth. Selection element layer 170 allows tunneling of electrons under a condition of a certain voltage or current may be used.

The selection element layer 170 may have a single-layered structure, or a multi-layered structure that uses a combination of two or more layers to achieve the desired selection element characteristics.

The above and other memory circuits or semiconductor devices based on the disclosed technology can be used in a range of devices or systems. FIGS. 8-12 provide some examples of devices or systems that can implement the memory circuits disclosed herein.

Figure 8:
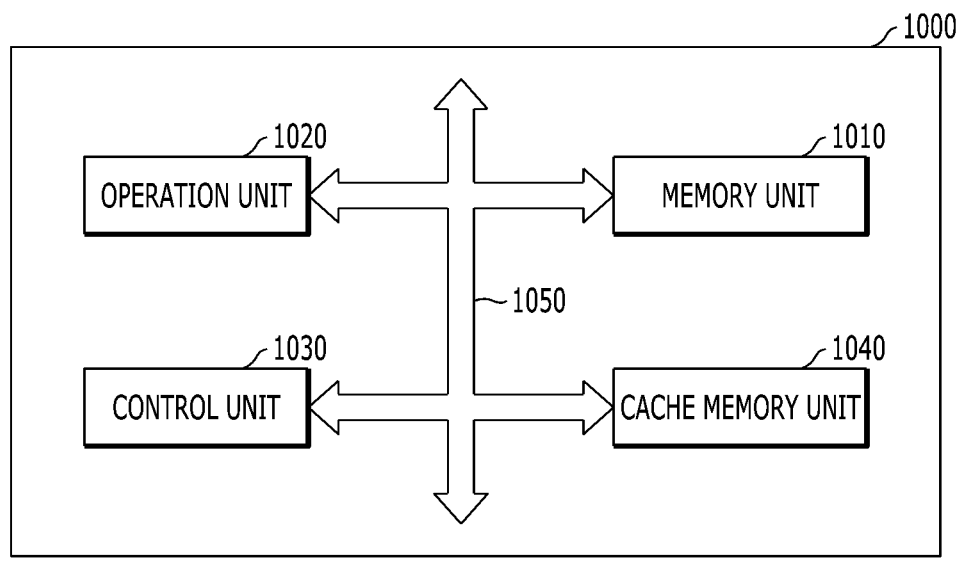
FIG. 8 illustrates a schematic configuration diagram of a microprocessor implementing memory circuitry based on the disclosed technology according to an embodiment of the present disclosure.

FIG. 8 illustrates a schematic configuration diagram of a microprocessor implementing memory circuitry based on the disclosed technology according to an embodiment of the present disclosure.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data from performing the operations, and addresses where data for performing of the operations are stored.

The memory unit 1010 may include one or more of the above-described semiconductor devices in accordance with the disclosed embodiments. For example, the memory unit 1010 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, in the memory unit 1010, the degree of integration may be increased and data storage characteristics may be improved. As a consequence, it is possible to reduce a size and improve operating characteristics of the microprocessor 1000.

The operation unit 1020 may perform four arithmetical operations or logical operations according to results that the control unit 1030 decoding of commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and control input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
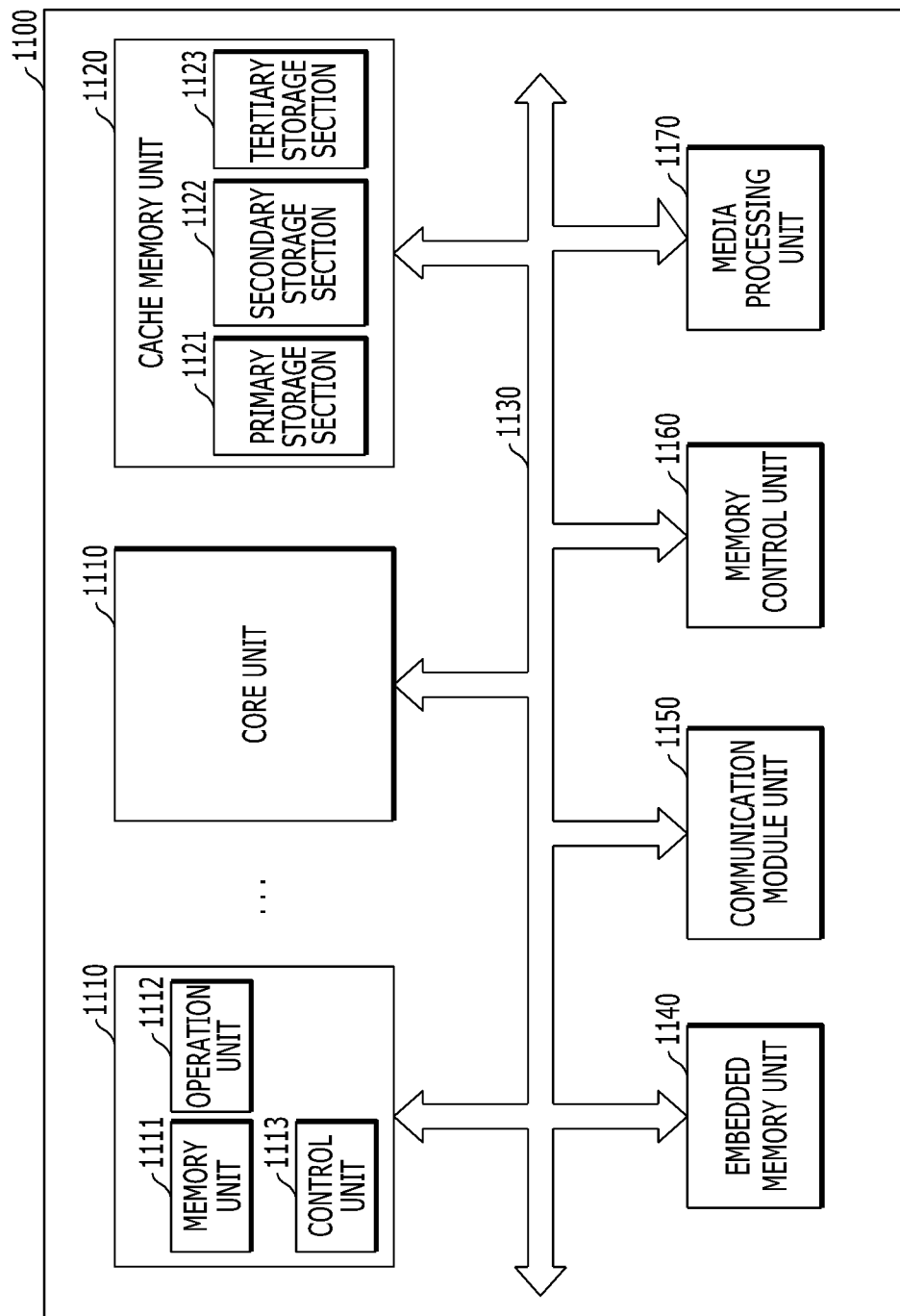
FIG. 9 illustrates a schematic configuration diagram of a processor implementing memory circuitry based on the disclosed technology according to an embodiment of the present disclosure.

FIG. 9 illustrates a schematic configuration diagram of a processor implementing memory circuitry based on the disclosed technology according to an embodiment of the present disclosure.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to store data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data from performing the operations, and addresses where data for performing of the operations are stored. The operation unit 1112 is a part which performs operations in the processor 1100. The operation unit 1112 may perform four arithmetical operations, logical operations, according to results that the control unit 1113 decodes, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the disclosed embodiments. For example, the cache memory unit 1120 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, the degree of integration may be increased and data storage characteristics may be improved in the cache memory unit 1120. As a consequence, it is possible to reduce a size and improve operating characteristics of the processor 1100.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network or both. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 administrates and processes data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
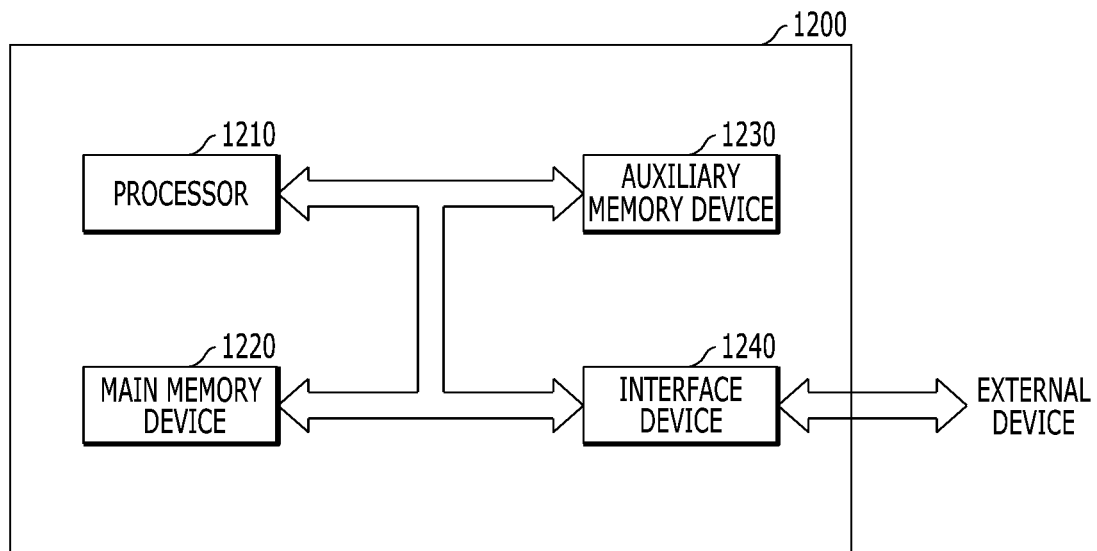
FIG. 10 illustrates a schematic configuration diagram of a system implementing memory circuitry based on the disclosed technology according to an embodiment of the present disclosure.

FIG. 10 illustrates a schematic configuration diagram of a system implementing memory circuitry based on the disclosed technology according to an embodiment of the disclosure.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, the degree of integration may be increased and data storage characteristics may be improved in the main memory device 1220. As a consequence, it is possible to reduce size and improve operating characteristics of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the disclosed embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, degree of integration may be increased and data storage characteristics may be improved in the auxiliary memory device 1230. As a consequence, it is possible to reduce size and improve operating characteristics of the system 1200.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to disclosed embodiments, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
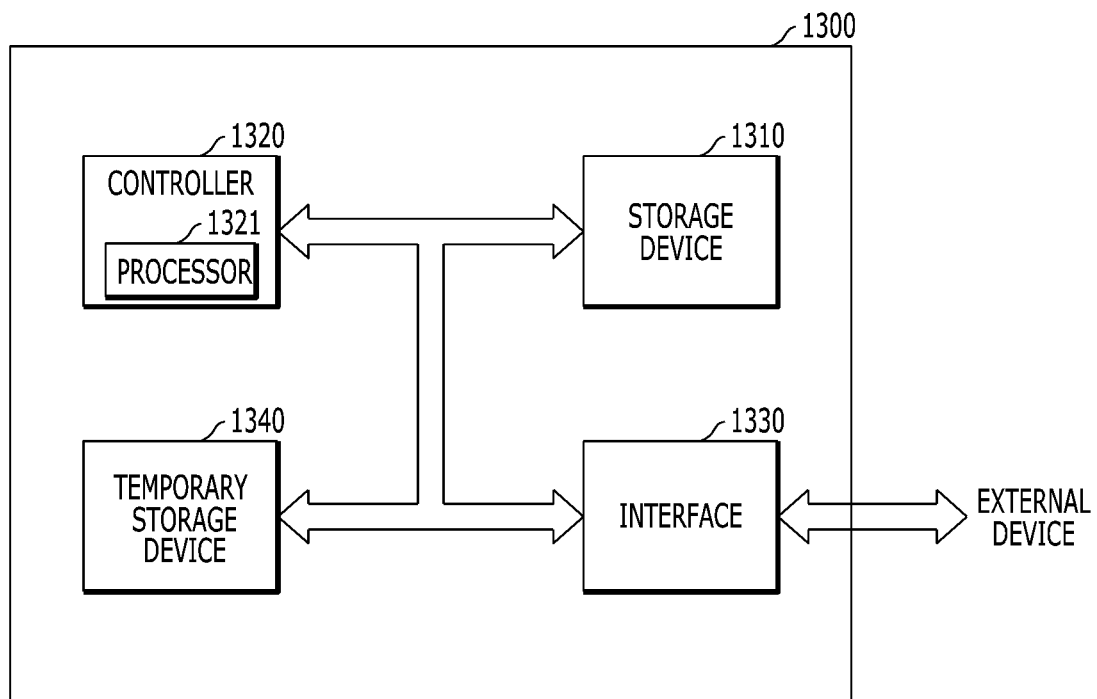
FIG. 11 illustrates a schematic configuration diagram of a data storage system implementing memory circuitry based on the disclosed technology according to an embodiment of the present disclosure.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, the degree of integration may be increased and data storage characteristics may be improved in the temporary storage device. As a consequence, it is possible to reduce size and improve operating characteristics of the data storage system.

Figure 12:
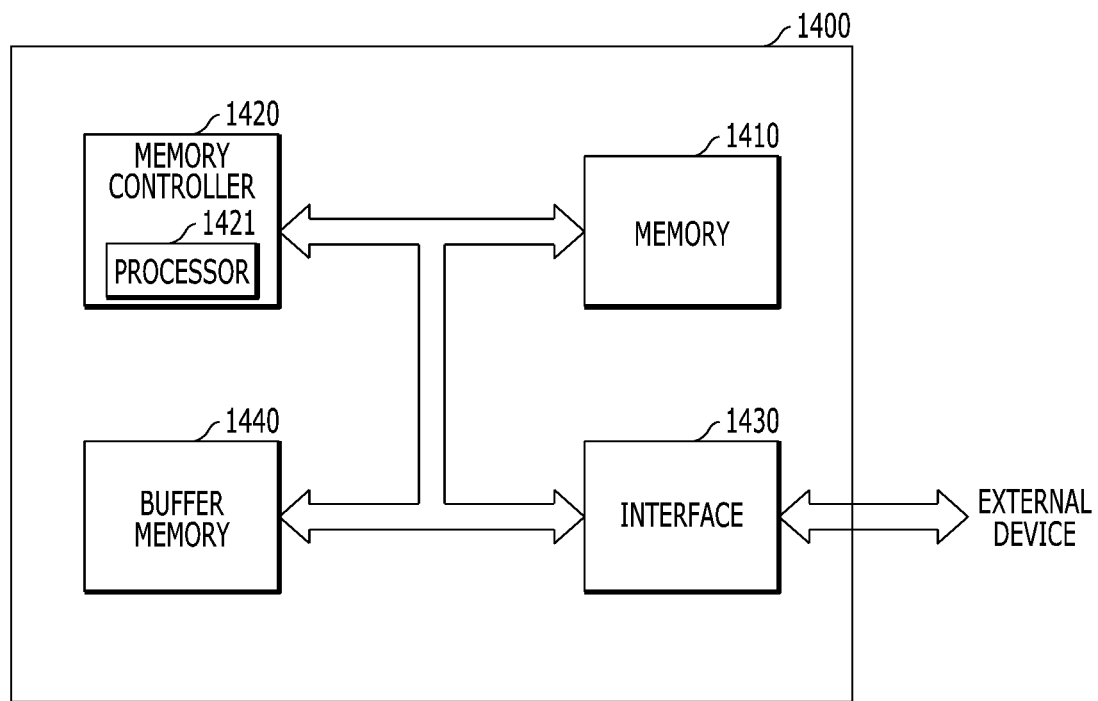
FIG. 12 illustrates a schematic configuration diagram of a memory system implementing memory circuitry based on the disclosed technology according to an embodiment of the present disclosure.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, degree of integration may be increased and data storage characteristics may be improved in the memory 1410. As a consequence, it is possible to reduce a size and improve operating characteristics of the memory system.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate having a substantially horizontal upper surface; first to Nth layers disposed in horizontal layers on the substrate and spaced apart from each other above the substrate in a vertical direction, wherein each of the first to Nth layers comprises a plurality of conductive lines; an insulating layer disposed to fill spaces between the conductive lines; a hole having sidewalls that extends in the vertical direction through the insulating layer and between the conductive lines to expose, in sidewalls of the hole, conductive lines of the first to Nth layers; a variable resistance layer disposed on sidewalls of the hole; and a conductive pillar disposed to fill the hole in which the variable resistance layer is formed, wherein N is a natural number of two or more. Through this, degree of integration may be increased and data storage characteristics may be improved in the buffer memory 1440. As a consequence, it is possible to reduce a size and improve operating characteristics of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, the semiconductor memory comprising:
    a substrate having a substantially horizontal upper surface;
    first to Nth layers (where N is a natural number of two or more) disposed in horizontal layers on the substrate and spaced apart from each other above the substrate in a vertical direction, wherein each of the first to Nth layers includes a plurality of conductive lines;
    an insulating layer disposed to fill spaces between the conductive lines vertically;
    a hole having sidewalls that extends in the vertical direction through the conductive lines of the first to Nth layers and the insulating layer therebetween;
    a variable resistance layer disposed on the sidewalls of the hole; and
    a conductive pillar disposed to fill the hole in which the variable resistance layer is formed.

2. The electronic device according to claim 1, wherein the conductive lines include first conductive lines which extend in a first horizontal direction and are arranged spaced apart from each other in a second horizontal direction crossing the first horizontal direction, and second conductive lines which extend in the second horizontal direction and are arranged spaced apart from each other in the first horizontal direction, and
    the first conductive lines and the second conductive lines are located at different layers of the first to Nth layers.

3. The electronic device according to claim 2, wherein, when the first conductive lines are located at a kth layer (where k is a natural number of 1 or more and N−1 or less) of the first to Nth layers, the second conductive lines are located at a k+1th layer.

4. The electronic device according to claim 2, wherein the conductive pillar, one of the first conductive lines of the first to Nth layers, and the variable resistance layer therebetween form a first memory cell, and
    the conductive pillar, one of the second conductive lines of the first to Nth layers, and the variable resistance layer therebetween form a second memory cell.

* * * * *